United States Patent
Akiyama et al.

(10) Patent No.: US 8,071,432 B2
(45) Date of Patent: Dec. 6, 2011

(54) ORGANIC TRANSISTOR ACTIVE SUBSTRATE, MANUFACTURING METHOD THEREOF, AND ELECTROPHORETIC DISPLAY

(75) Inventors: Yoshikazu Akiyama, Kanagawa (JP); Takumi Yamaga, Kanagawa (JP); Takanori Tano, Kanagawa (JP); Hidenori Tomono, Kanagawa (JP); Akishige Murakami, Kanagawa (JP); Hitoshi Arita, Kanagawa (JP); Mayuka Araumi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 172 days.

(21) Appl. No.: 11/517,737

(22) Filed: Sep. 7, 2006

(65) Prior Publication Data

US 2007/0054212 A1  Mar. 8, 2007

(30) Foreign Application Priority Data

Sep. 8, 2005 (JP) ................ 2005-260077
Jul. 11, 2006 (JP) ................ 2006-190067

(51) Int. Cl.
*H01L 21/00* (2006.01)
*H01L 21/84* (2006.01)

(52) U.S. Cl. ............. 438/149; 438/82; 438/99; 257/40; 257/E21.299

(58) Field of Classification Search ............ 438/82, 438/99, 149; 257/40, E21.299
See application file for complete search history.

(56) References Cited

U.S. PATENT DOCUMENTS

| 3,945,831 | A * | 3/1976 | Satomura ................ 430/287.1 |
| 6,506,438 | B2 * | 1/2003 | Duthaler et al. ............ 427/58 |
| 6,874,898 | B2 | 4/2005 | Akiyama |
| 7,344,914 | B2 * | 3/2008 | Hsieh et al. ................ 438/99 |
| 2002/0098346 | A1 * | 7/2002 | Yitzchaik ................ 428/339 |
| 2003/0213952 | A1 | 11/2003 | Iechi et al. |
| 2003/0214042 | A1 * | 11/2003 | Miyazawa .............. 257/758 |
| 2004/0212042 | A1 | 10/2004 | Sagisaka et al. |

(Continued)

FOREIGN PATENT DOCUMENTS

JP  2003-255857  9/2003

(Continued)

OTHER PUBLICATIONS

Dimitrakopoulos et al. "Organic thin-film transistors: A review of recent advances", 2001, IBM J. Res. & Dev. vol. 45 No. 1, pp. 11-27.*

(Continued)

*Primary Examiner* — Alexander Ghyka
*Assistant Examiner* — Leonard Chang
(74) *Attorney, Agent, or Firm* — Cooper & Dunham LLP

(57) ABSTRACT

A method of manufacturing an organic transistor active substrate is disclosed. The organic transistor active substrate includes an organic transistor in which a first electrode is formed on a substrate, a first insulating film is formed on the first electrode, a pair of second electrodes is formed on the first insulating film, and an active layer made of an organic semiconductor material is formed on the pair of second electrodes. The organic transistor is laminated with a second insulating film, and the second insulating film is laminated with a third electrode which is electrically coupled to one of the second electrodes via a through-hole provided through the second insulating film. The first electrode is formed by inkjet ejection; the first insulating film is formed by coating; the pair of second electrodes is formed by inkjet ejection; the active layer is formed by inkjet ejection; the second insulating film is formed by screen printing; and the third electrode is formed by screen printing.

9 Claims, 6 Drawing Sheets

U.S. PATENT DOCUMENTS

2005/0156244 A1 7/2005 Akiyama
2007/0013305 A1* 1/2007 Wang et al. .................. 313/553

FOREIGN PATENT DOCUMENTS

| JP | 2003-318196 | 11/2003 |
| JP | 2004-241527 | 8/2004 |
| JP | 2005-64122 | 3/2005 |

OTHER PUBLICATIONS

Lim et al., "New method of driving an OLED with an OTFT", Jun. 2005, Synth. Met. vol. 151, pp. 197-201.*
DeFelsko web publication, "Screen Printing Process Measurements", published online Jun. 2004.*

* cited by examiner

INTERLAYER INSULATING FILM PRINT SAMPLE WITH TH
(PHOTOGRAPH)

ORGANIC TRANSISTOR ACTIVE SUBSTRATE, MANUFACTURING METHOD THEREOF, AND ELECTROPHORETIC DISPLAY

BACKGROUND

1. Technical Field

This disclosure relates generally to active substrates using organic transistors, and more particularly to an organic transistor active substrate, a manufacturing method thereof, and an electrophoretic display using the organic transistor active substrate that can be manufactured by simple methods at low cost.

2. Description of the Related Art

Conventionally, the following matrix type displays are known: passive type displays and active type displays. A passive type display is driven by a scanning electrode and a data electrode that are mutually orthogonal. An active type display selects pixels to be lit by using a switching element such as a transistor and a memory element.

Examples of active type displays are disclosed in Japanese Laid-Open Patent Application No. 2003-255857 "Organic EL Display" (Patent Document 1), Japanese Laid-Open Patent Application No. 2003-318196 "Active element and display device with the same" (Patent Document 2), Japanese Laid-Open Patent Application No. 2004-241527 "Organic active element and display element having the same" (Patent Document 3), and Japanese Laid-Open Patent Application No. 2005-64122 "Ink and method for forming organic semiconductor pattern, electronic element, and electronic element array" (Patent Document 4). An active type display has a structure driven by a simple matrix, and an active element (switching element) is added to each pixel, so that a target pixel can be turned on/off. Accordingly, active type displays can be used for displaying videos when high image quality and fast response speed are required.

In the technology disclosed in Japanese Laid-Open Patent Application No. 2003-255857 (Patent Document 1), each pixel included in a matrix array formed on a substrate includes at least one organic EL (Electro Luminescence) element which is driven by two or more organic thin-film transistors (TFTs). Each organic TFT includes a gate electrode, a gate insulating film, an organic semiconductor layer coating the gate insulating film, a source electrode, and a drain electrode. The gate insulating film serves as an active substrate for an organic EL display, which includes a metal oxide film that is formed by anodically oxidizing the surface of the gate electrode. Accordingly, organic TFTs of low threshold voltage and low operating voltage can be formed at a low process temperature.

Organic semiconductor active elements (transistors) and electrophoretic display devices using the active elements are disclosed in Japanese Laid-Open Patent Application No. 2003-318196 (Patent Document 2) and Japanese Laid-Open Patent Application No. 2004-241527 (Patent Document 3).

Japanese Laid-Open Patent Application No. 2005-64122 (Patent Document 4) discloses ink that is useful for forming organic semiconductor patterns, and an electronic element and an electronic element array in which electrodes are formed by an inkjet printing method employing the aforementioned ink.

Patent Document 1: Japanese Laid-Open Patent Application No. 2003-255857

Patent Document 2: Japanese Laid-Open Patent Application No. 2003-318196

Patent Document 3: Japanese Laid-Open Patent Application No. 2004-241527

Patent Document 4: Japanese Laid-Open Patent Application No. 2005-64122

As described in the above conventional technologies, there have been attempts to manufacture display panels by disposing transistors made of organic semiconductor materials on arrays to form active substrates, and laminating the active substrates with display elements. FIG. 4 is a schematic diagram of such a display panel. As shown in FIG. 4, electrophoretic microcapsules 9 are provided between an electrode of an active substrate and a transparent electrode 10. A supporting substrate is denoted by 11.

Another example of a display panel is shown in FIG. 7. An electrophoretic dispersion liquid 13 is provided in spaces (denoted by 13), which spaces are formed by providing partition layers 12 that join the supporting substrate and the active substrate.

The active substrate is laminated with the display element as follows. As shown in FIG. 1, an organic thin-film transistor (hereinafter, "organic TFT) includes a substrate 1, a gate electrode 2, a gate insulating layer 3, source/drain electrodes 4, and an active layer 5. As shown in FIG. 2, a pixel electrode (individual electrode 8) needs to be disposed on the organic TFT via an interlayer insulating film 6. However, properties of the organic TFT may deteriorate when forming the interlayer insulating film 6 or subsequently forming a throughhole 7.

The following conditions need to be satisfied when forming the interlayer insulating film 6: (1) form the film at low temperature (when the substrate is made of plastic, the process temperature is to be equal to or less than 200° C.); (2) prevent damage (transistor performance is prevented from declining due to film formation); and (3) keep the process simple (keep costs low; vacuum film formation entails high costs in the device and large environmental effect (e.g. electricity)).

Next, conventional methods of forming the interlayer insulating film 6 and their problems are described.
a) Vacuum film formation of inorganic insulating film
a1) Plasma CVD (chemical vapor deposition) method using silane gas
   not simple process, plasma damage occurs
a2) Sputtering method
   not simple process, plasma damage occurs
a3) Film formation by SOG (spin on glass)
   requires heat treatment at a temperature equal to or greater than 200° C.
b) Organic insulating layer
b1) Cast film formation by various insulating polymers
Among the above examples, the b) organic insulating layer is considered as preferable.

Methods of forming the interlayer insulating film 6 and their problems are described in further detail.

First, methods of forming the a) inorganic insulating film and their problems are described.

The a1) plasma CVD (chemical vapor deposition) method is performed by placing a sample in a vacuum chamber and evacuating the chamber. Silane gas serving as material gas and reactant gas that promotes oxidation reaction are injected into the chamber. A desired oxidized silicon film is obtained due to adherence/thermal decomposition reaction of the material gas on the substrate surface. The plasma CVD method assists the reaction by discharging radio frequency energy, and is therefore advantageous in film formation at low temperature. The plasma CVD method is typically performed with the substrate temperature at about 300° C.

Next, a description is given of the a2) sputtering method, which is also a type of vacuum film formation method, similar to the plasma CVD method.

In the sputtering method, an argon gas plasma is formed by discharging RF energy as mentioned above. A target material to be used for film formation is placed facing against the substrate and deposited onto the substrate by a sputtering phenomenon. The film formation can be performed in room temperature, although the film quality may depend on the temperature.

Disadvantages of the above film formation methods are as follows:
(1) Inconvenience of using a vacuum device
(2) The sample is exposed to an environment including positive charges and negative charges, which electrically damage the sample (generally referred to as plasma damage). Particularly, failures occur when forming an interlayer insulating layer on the transistor. Examples of the failures include drifting of the threshold voltage of the transistor and a decline in the insulating resistance value of the gate insulating film.

Next, problems of the a3) SOG method are described.

In a typical SOG method, a solution whose major component is tetraethoxysilane is made into a coating film by spin coating and then heat treated to obtain an oxide silicon film. Accordingly, film formation can be performed with a simple device such as a spin coating device, without requiring a vacuum device. However, in this film formation method, tetraethoxysilane is subject to hydrolytic cleavage, polycondensation, and dehydration reaction; therefore, heat treatment of 200° C. is required (heat treatment of 400° C. is required in the case of withdrawal of residual water group). Accordingly, this method cannot be employed when the substrate is made of a material such as plastic, which restricts the heat treatment temperature.

As described above, a) formation of inorganic insulating films entails various problems; therefore, organic insulating films are preferable. However, when forming organic insulating films, it is necessary to open a through-hole to obtain conductivity between one of the pair of electrodes of the transistor and the pixel electrode.

Generally, the through-hole is opened by photolithographic etching. However, when forming an organic insulating film, there is a problem in that an organic solvent included in photoresist elutes the base insulating film. The organic solvent used for removing the photoresist after the etching process also elutes the base insulating film.

When the etching is done by a dry process, plasma damage is incurred by the TFT. Specifically, the sample is disposed on the side of a ground electrode in a vacuum chamber in which RF plasma can be discharged, a reactant gas including a fluorine compound is injected into the chamber, and plasma is generated. On the ground side, the electron mobility and the hole mobility are different from each other; therefore, a bias electric field is generated in a self-aligned manner. In the dry etching process, fluorine ions that are accelerated by this bias are irradiated onto the sample to cause chemical reactions in volatile substances, thereby removing the photoresist. Similar to the above example, the bias electric field also causes drifting of the transistor performance and deterioration of breakdown resistance of the gate insulating film, thereby causing plasma damage. Thus, even with the cast film formation method using an organic insulating film, the results are unsatisfactory.

To address the above problems, there is a technology of forming an interlayer insulating film by depositing beforehand an organic insulating film in areas apart from the through-hole, and providing the through-hole by screen printing.

Next, the principle, the performance, and problems of screen printing are described.
a) Principle of Screen Printing An emulsion is disposed on a stainless mesh with a desired aperture (screen printing plate), and printing ink is transferred from the aperture of the plate to a print object by squeegee action. The printed matter is evened out by leveling the transferred ink (see FIG. 5).
b) Print Pattern and Required Ink Performance Description for Print Pattern A An emulsion that blocks ink is disposed in an inverse pattern. A stainless mesh is provided at the emulsion aperture, which hampers the passage of ink. Immediately after the squeegee action, ink is transferred onto the print object in island-like forms. As time passes, the island-like forms of ink are leveled, changing into a planar, continuous film, and forming a pattern. This leveling operation has a detrimental effect in terms of reproducing dimensions of the pattern. Specifically, due to the leveling operation, the resultant print pattern becomes larger than the original dimensions of the aperture in the emulsion.

Description for Print Pattern B

By the same principle, dimensions of the through-hole become small.

Generally, print pattern A and print pattern B are distinguished as a positive type and a negative type, respectively. In conventional screen printing methods, negative type patterns are rarely used.

Screen printing is performed to form structures (thick-film patterns) for electrode printing in rib materials and multilayer ceramic wiring substrates of plasma displays, and internal electrode printing in laminated ceramic condenser components. In these examples, positive type patterns are used.

Negative type pattern printing is occasionally performed to form protective films for a mounting circuit board. In this case, an aperture is formed with dimensions in millimeter order. The positive type patterns have dimensions of 30 μm to 50 μm for mass production, and 10 μm to 30 μm for research stages. In general, the criteria values of stable machining for negative type patterns are 200 μm to 300 μm.

Through-hole dimensions designed for organic TFT array substrates are approximately 150 μm to 5 μm, which are less than or equal to the criteria values of stable machining; although these dimensions may depend on the pixel integration density. Accordingly, screen printing has not been conventionally employed for printing interlayer insulating films, although the method is simple.
c) Problems in Application to Organic TFT As shown in FIG. 2, the interlayer insulating film 6 is directly laminated on the organic semiconductor layer (the active layer 5 shown in FIG. 1). Thus, the organic solvent included in the interlayer film ink (hereinafter, simply referred to as "paste") dissolves or swells the organic semiconductor layer, which may result in degraded semiconductor properties. Accordingly, there is a need for a simple method of manufacturing elements in which these problems are solved.

Next, examples of manufacturing an amorphous Si active substrate and an organic semiconductor (pentacene) active substrate are described.

An active substrate using organic semiconductor materials is more advantageous than an active substrate using Si system semiconductor materials employed in flat panel displays. Specifically, the advantages include reductions in manufacturing costs due to simple processes, use of a simple manufacturing device, and product cost reductions accompanied by using the simple device. Today, efforts are being made to develop active substrates using organic semiconductor materials for flat panel displays.

<Example of manufacturing amorphous Si active substrate>
1. Substrate
2. Formation of gate electrode (first electrode)
   chromium vacuum film formation, photolithographic etching
3. Formation of gate insulating film (first insulating film)
   $SiO_2$ vacuum film formation (sputtering film formation)
4. Formation of active layer
   film formation of hydrogenated amorphous Si by plasma CVD (chemical vapor deposition) method and photolithographic etching
5. Formation of source/drain electrodes (second electrode pair)
   aluminum vacuum film formation, photolithographic etching
6. Formation of interlayer insulating film (second insulating film)
   $SiO_2$ vacuum film formation (sputtering film formation)
7. Open contact hole
   photolithographic etching
8. Formation of individual electrode (third electrode)
   aluminum vacuum film formation, photolithographic etching <Example of manufacturing organic semiconductor (pentacene) active substrate>
1. Substrate
2. Formation of gate electrode (first electrode)
   chromium vacuum film formation, photolithographic etching
3. Formation of gate insulating film (first insulating film)
   $SiO_2$ vacuum film formation (sputtering film formation)
4. Formation of source/drain electrodes (second electrode pair)
   aluminum vacuum film formation, photolithographic etching
5. Formation of active layer
   film formation of pentacene by vacuum evaporation and photolithographic etching
6. Formation of interlayer insulating film (second insulating film)
   $SiO_2$ vacuum film formation (sputtering film formation)
7. Open contact hole
   photolithographic etching
8. Formation of individual electrode (third electrode)
   aluminum vacuum film formation, photolithographic etching The difference between forming the amorphous Si active substrate and the organic semiconductor (pentacene) active substrate is the method of forming the active layer. The hydrogenated amorphous Si is formed by the plasma CVD method. To obtain a high-quality semiconductor, the substrate temperature needs to be high enough (at 250° C. to 350° C.); therefore, the active substrate is made of glass.

On the other hand, the substrate temperature can be at room temperature in the case of film formation for the pentacene semiconductor; therefore, the active substrate can be made of plastic.

In terms of the manufacturing device, a plasma CVD device is used instead of a vacuum evaporation device; therefore, the cost of the device and running costs are certainly reduced.

Recently, the field of printing electronics has been rapidly growing. Specifically, there is a technology of forming conventional metal wirings by an inkjet method or other printing methods by using conductive polymers or nano-metal ink. There is another technology of forming a pattern for a functional film without performing vacuum film formation; i.e., making ink from an organic semiconductor material other than pentacene such as a polymer, by dissolving it in a solvent.

For example, organic semiconductor materials such as polythiophene and fluorene-thiophene copolymer are used in these technologies.

When a fluorene-thiophene copolymer (F8T2) is formed by the inkjet method in the example of manufacturing an organic semiconductor (pentacene) active substrate described above, an even more simple process can be performed at step 5 instead of vacuum evaporation and photolithographic etching. It is also possible to make ink from polyethylene-dioxy-thiophene (PEDOT) to obtain a conductive polymer to be used for wiring, or to use nano-silver ink for an inkjet coating and applying heat treatment of 200° C. to be used for wiring.

These printing electronics technologies can substitute for the vacuum film formation and photolithographic etching processes performed in forming electrodes at steps 1, 2, and 3; therefore, simplification of processes and devices can be promoted significantly.

When the inkjet method is employed for forming a wiring pattern, the dimensions of the pattern are restricted by the volume of ejected ink and landing accuracy of ink. Presently, wirings of 100 microns can be formed; however, improvements need to be made to form even more microscopic wirings.

The inventors of the present invention have succeeded in forming a pattern having intervals of 5 μm for a second electrode layer of a transistor by using the inkjet coating method. Specifically, the pattern is formed by simple processes including changing the surface energy of the base, and applying light treatment on surfaces that easily absorb ink and surfaces that do not easily absorb ink; and by a self-eliminating mechanism of the coated ink (see Patent Document 3). It is imperative to form a pattern with microscopic intervals for the second electrode of the transistor in order to enhance performance of the transistor. Further, an application of a wiring technology employing the inkjet method has been submitted with Patent Document 4.

An organic transistor active substrate according to an embodiment of the present invention includes the organic transistor having a structure as shown in FIG. 2, on which the through-hole 7, the interlayer insulating film 6, and the individual electrode 8 are two-dimensionally disposed. The organic transistor active substrate transmits image signals from a source electrode of the organic transistor to the individual electrode (pixel electrode 8) via the through-hole 7.

FIG. 3 is a top view of the organic transistor active substrate. The organic transistor active substrate includes a gate electrode 302, a drain electrode 304, a source electrode 305, a signal line 308, a scanning line 309, and a pixel electrode 310 (corresponding to the individual electrode 8 shown in FIG. 2).

An electrophoretic display according to an embodiment of the present invention has a structure as shown in FIG. 4, in which the electrophoretic microcapsules 9 are enclosed in between the individual electrode 8 and the transparent electrode 10 supported by the supporting substrate 11. The electrophoretic display displays black/white according to image signals received by the individual electrode 8 of the organic transistor. The structure shown in FIG. 4 is used for one pixel.

The manufacturing method using the conventional printing technology of the organic transistor shown in FIG. 1 can be significantly simplified as follows (the arrow → indicates the improvement).

1. Substrate
2. Formation of gate electrode (first electrode)
   chromium vacuum film formation, photolithographic etching
   → formation by nano-silver ink/IJ (inkjet) method
   (vacuum film formation, photolithographic etching are not performed)
3. Formation of gate insulating film (first insulating film)
   $SiO_2$ vacuum film formation (sputtering film formation)
   → formation of polyimide by spin coating
   (vacuum film formation is not performed)
4. Formation of source/drain electrodes (second electrode pair)
   aluminum vacuum film formation, photolithographic etching
   → formation by partial surface modification of polyimide by light irradiation+nano-silver ink/IJ method
   (vacuum film formation, photolithographic etching are not performed to form resist pattern for processing)
5. Formation of active layer
   film formation of pentacene by vacuum evaporation, and photolithographic etching
   → formation with polymer organic semiconductor material by IJ method (vacuum film formation, photolithographic etching are not performed)

With this simplified method, costs can be significantly reduced.

However, the conventional method is performed in subsequent processes to form the interlayer insulating film (second insulating film) 6, to open the contact hole, and to form the individual electrode 8 shown in FIG. 2; therefore, costs are not thoroughly reduced.

A preferable printing method for manufacturing an active substrate made of organic TFT is described below.

To form a first electrode layer (gate electrode), a method of printing a pattern of less than or equal to 100 µm is selected. Examples of such a method include inkjet printing, intaglio printing, and relief printing. A second feature required in the electrode layer formation is to form a thin electrode film.

The transistor is formed by laminating a functional film, and the resulting laminated pattern needs to be prevented from being cut off due to a difference in levels with the base. In intaglio printing, it is possible to print patterns with line widths of 20 µm, so that the resolution is sufficient; however, intaglio printing is inappropriate for forming thin films (the film thickness is generally 2 to 3 µm in intaglio printing).

Another property required in a printing method for the electrode layer formation is that the printing ink type is not restricted. An electrode is formed by printing with nano-metal ink, and the electrode is heat treated so as to provide conductivity. An intaglio printing material, which does not degrade properties of nano-metal ink, is now being developed. On the other hand, any type of ink can be used with the inkjet method as long as the viscosity and the surface tension are matched. It is preferable to use the same manufacturing device for forming the source/drain electrodes to be described later, because the inconvenience of using plural devices and managing plural manufacturing methods can be eliminated, and capital investment costs can be reduced.

Properties required for a printing method for forming a second electrode layer (source/drain electrodes) are as follows: a space of less than or equal to 20 µm can be resolved, and the positional shift with respect to the base pattern needs to be less than or equal to 3 µm. The aforementioned intaglio printing and relief printing methods do not satisfy the requirement of positional alignment. The inventors of the present invention have proposed an IJ printing method employing a technology for controlling wettability of polyimide by light irradiation (Japanese Laid-Open Patent Application No. 2006-060079).

The IJ method is preferable for printing on organic semiconductor material, because any ink type can be applied, and is also advantageous in that the same manufacturing device can also be used for forming the source/drain electrodes.

Properties required for a printing method for forming an interlayer insulating film are described below. The pixel electrode is disposed on the interlayer insulating film; therefore, sufficient electrical insulating properties need to be realized, and the interlayer insulating film needs to be adequately isolated dielectrically. The reason is that when the pixel electrode is provided with electric potential, the interlayer insulating film serves as a dielectric film and provides a dielectric field to the base organic semiconductor layer. This may cause the operating point of the transistor to shift. In order to solve such a problem, the interlayer insulating film needs to have a thickness of several µm.

A through-hole needs to be formed through the interlayer insulating film having a thickness of several µm, in order to make electric connection with the base electrode. Accordingly, the interlayer insulating film is to be printed beforehand in parts apart from the electrical connection. With the intaglio printing method, thick films can be formed; however the printing positions cannot be sufficiently aligned with respect to the base pattern. On the other hand, these disadvantages can be solved with the screen printing method.

When forming pixel electrodes, an electrical disconnection at the through-hole is prevented by printing the film with a thickness corresponding to concavities and convexities of the printing base. This requires a printing method in which positional alignment is highly precise and thick films can be formed; accordingly, the screen printing method is selected. Screen printing is also employed for forming interlayer insulating films, and is therefore advantageous in that a common device can be used and manufacturing methods are conveniently managed.

BRIEF SUMMARY

In an aspect of this disclosure, there are provided a method for manufacturing an active substrate including an organic TFT by simple processes at low cost, and an active substrate and an electrophoretic display manufactured by the manufacturing method.

An embodiment of the present invention provides a method of manufacturing an organic transistor active substrate including an organic transistor in which a first electrode is formed on a substrate, a first insulating film is formed on the first electrode, a pair of second electrodes is formed on the first insulating film, and an active layer made of an organic semiconductor material is formed on the pair of second electrodes, the organic transistor being laminated with a second insulating film, and the second insulating film being laminated with a third electrode which is electrically coupled to one of the second electrodes via a through-hole provided through the second insulating film, the method including the steps of forming the first electrode by inkjet ejection; forming the first insulating film by coating; forming the pair of second electrodes by inkjet ejection; forming the active layer by inkjet ejection; forming the second insulating film by screen printing; and forming the third electrode by screen printing.

According to one embodiment of the present invention, it is possible to manufacture an active substrate including an organic TFT that can be entirely manufactured by printing processes, so that costs of the manufacturing operation and the manufacturing device can be reduced. Further, the electrophoretic display can be manufactured at low cost.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
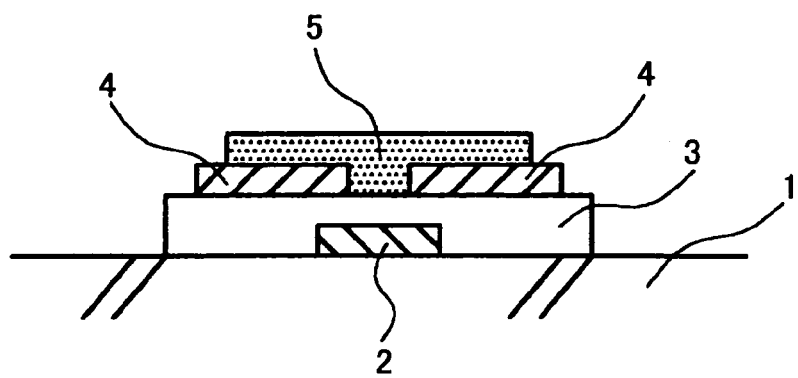
FIG. 1 is a schematic diagram of an organic transistor formed on a substrate, which is the basis of an embodiment of the present invention.
Figure 2:
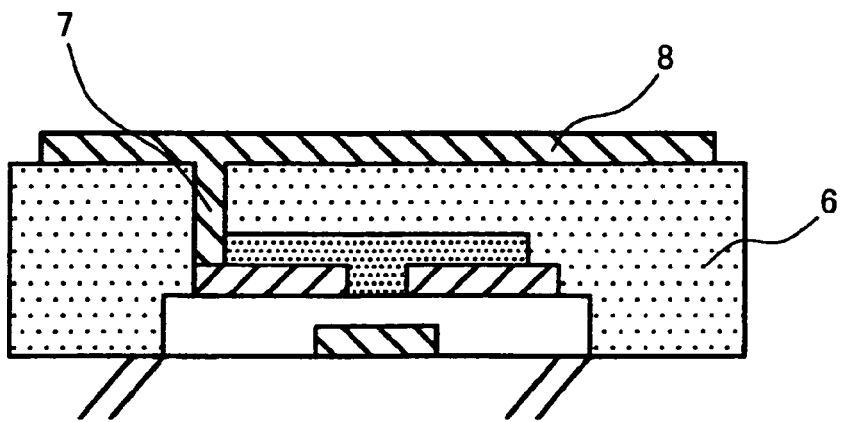
FIG. 2 is a schematic diagram of an active substrate according to an embodiment of the present invention, including an interlayer insulating film coating the organic transistor and an electrode (individual electrode) electrically connected to one of the electrodes (source) of the transistor via a through-hole.
Figure 3:
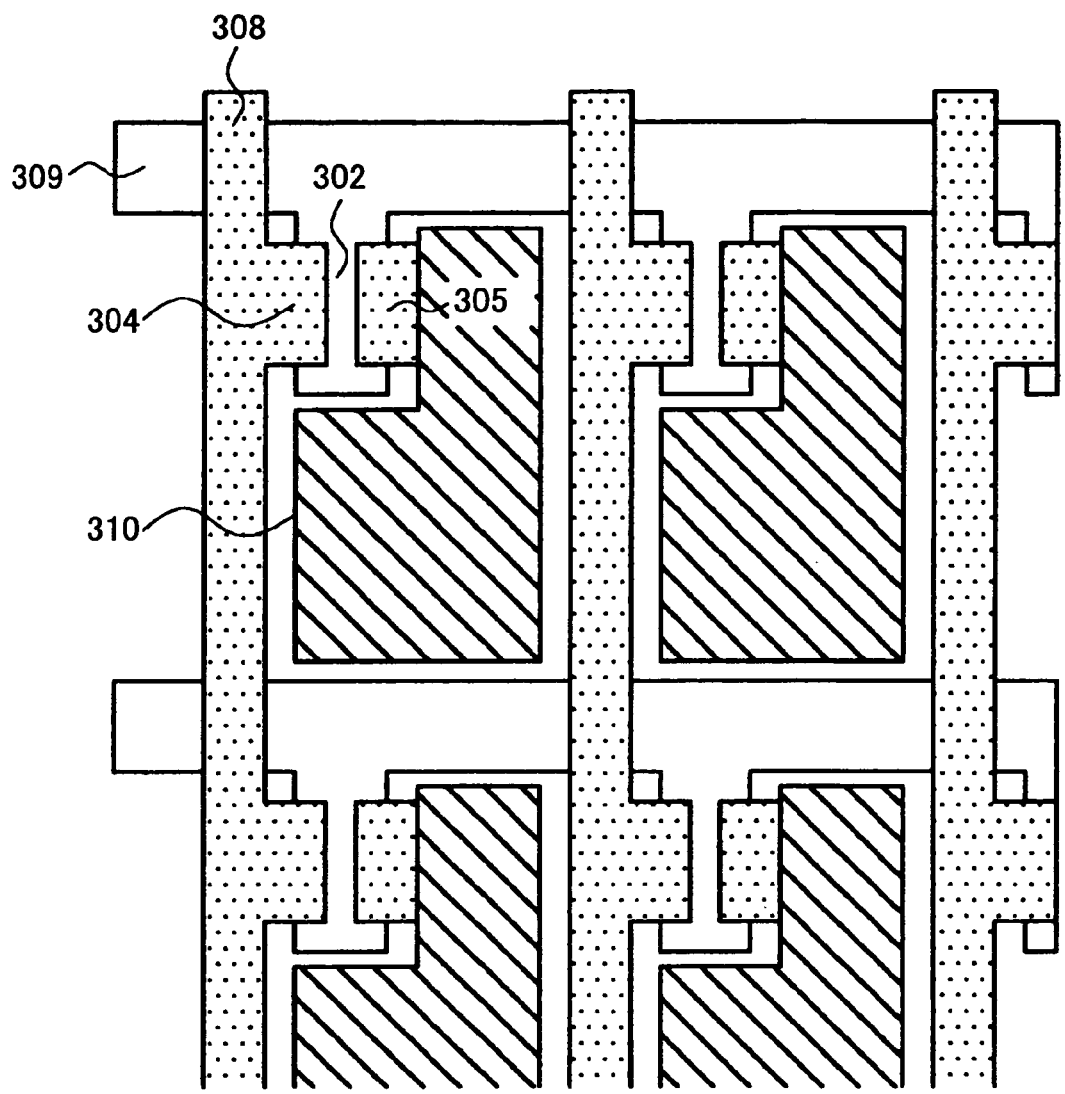
FIG. 3 is a plan view of an organic transistor active substrate according to an embodiment of the present invention.

A description is given, with reference to the accompanying drawings, of embodiments of the present invention.

(Outline of Invention)

In an embodiment of the present invention, a resin such as polyvinyl butyral resin is dissolved with an alcohol solvent having at least ether linkage to make a paste. The paste is used for forming the second insulating layer by the screen printing method. The third electrode (individual electrode, pixel electrode) is also formed by the screen printing method.

The alcohol solvent having at least ether linkage is a cellosolve system solvent. This solvent is deposited on an active layer including an organic semiconductor; therefore, the solvent needs to have low solubility with respect to the material of the active layer.

The paste is formed in consideration of vapor pressure of the organic solvent; therefore, butoxyethanol is particularly preferable in an embodiment of the present invention.

In an embodiment of the present invention, an insulating polymer is made into a paste by using a solvent including at least butoxyethanol, and a film is formed by the screen printing method. Accordingly, the second insulating film can be formed without opening the contact hole. Subsequently, screen printing is performed by using a paste including silver particles, thereby achieving electrical conductivity between one of the second electrodes of the transistor.

Practical examples of embodiments according to the present invention are described below.

EXAMPLE 1

(1) Formation of Organic Transistor

Commercially available nano-silver ink was used to print a desired pattern on a glass substrate by using an inkjet device manufactured by Ricoh Printing Systems, Ltd. The pattern was heat treated at 200° C. to form the first electrode.

Next, thermal polymerization type polyimide was coated as the first insulating film by spin coating, and heat treated at 280° C. Subsequently, ultraviolet rays were irradiated to desired parts (where second electrodes are to be formed, described later) via a photomask, to modify the surface. The superposition accuracy of the photomask on the first electrode pattern was calculated, and the shift amount was within ±10 μm with respect to the total pitch of 200 mm.

Next, similar to the formation of the first electrode, nano-silver ink was used in an IJ method to form the second electrodes. The exposure part cannot recognize the pattern by CCD observation. Accordingly, the substrate was matched with the first pattern, and IJ printing was performed based on printing data to obtain a laminated pattern. The superposition accuracy of the laminated pattern was within ±10 μm with respect to the total pitch of 200 mm. The pattern was reproduced by an ink reproducibility of substantially 100% on the wettability-controlled surface; however, the shift of ±10 μm was caused by a shift of the photomask superposed at the time of exposure.

The active layer was formed by making ink from an organic semiconductor material having a triallyl amine structure as shown in the following chemical formula (chem. 1) by dissolving it in xylene. The ink density was 1 wt %, the viscosity was 5 mPa seconds, and the surface tension was approximately 30 mN/m. Subsequently, the ink was used to form a film on a desired position by the IJ method, thereby achieving an organic transistor.

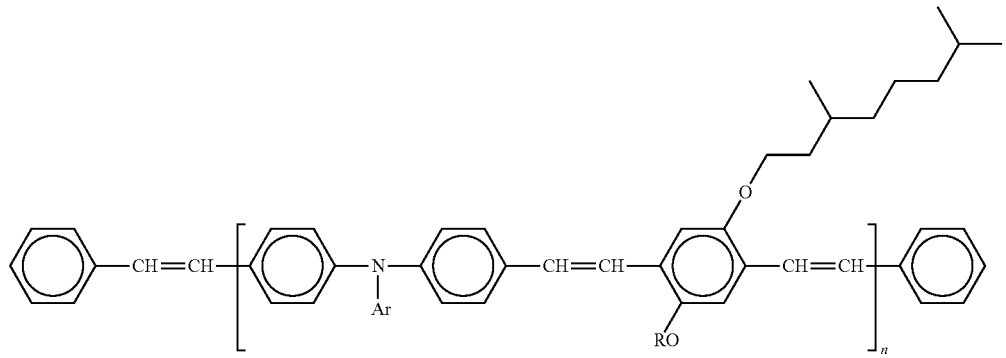

[Chem. 1]

Ar is Aryl, R is Alkyl (2) Formation of Second Insulating Film

Polyvinyl butyral resin manufactured by Sekisui Chemical Co., Ltd. was dissolved in terpineol and butoxyethanol. To adjust the viscosity to a level appropriate for printing (60,000 to 200,000 mPas), an insulating filler was added, and the resin was kneaded in a three-roll mill, to obtain a paste to be used for screen printing.

To obtain uniform particles as an insulating filler, a hydrothermal synthesis barium titanate manufactured by Sakai Chemical Industry Co., Ltd. (average particle diameter 0.1 microns) was added to the paste. Specifically, 70 wt % of barium titanate filler was added to polyvinyl butyral density: 5 wt % (terpineol+butoxyethanol) binder.

Figure 6:
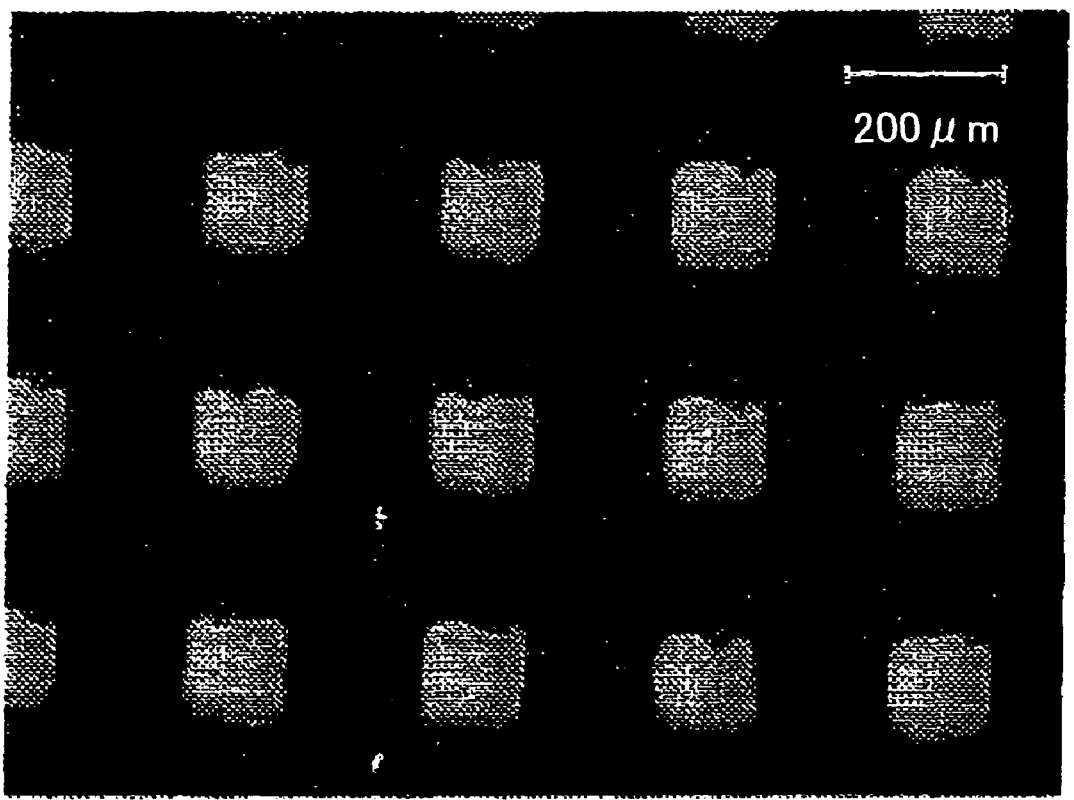
FIG. 6 is a photograph of a printing sample of an interlayer insulating film including a through-hole (TH) formed according to an embodiment of the present invention.

The paste obtained by making the above adjustments was used for screen printing (screen plate of calendar mesh: no. 500 and emulsion thickness of 5 microns), and then dried at 120° C., to form the second insulating film. In a sample of the second insulating film shown in FIG. 6, it was confirmed that a through-hole of approximately 100 μm×100 μm was formed.

(3) Formation of Third Electrode

A silver paste manufactured by Daiken Chemical Co., Ltd. was used for screen printing under similar screen plate conditions, and dried at 120° C. to form a third electrode (individual electrode, pixel electrode).

In this example, a transistor having a transistor channel length of 5 microns, a channel width of 1,000 microns, in which the gate insulating film has a specific inductive capacity of 3.6 and a film thickness of 400 nm was manufactured, and the transistor performance was evaluated by a semiconductor parameter analyzer.

The measurement conditions were as follows: when $VDS=-20$ V, $VG=-20$ V, the on current was $6\times10^{-7}$ A; when $VDS=-20$ V, $VG=0$ V, the off current was $3\times10^{-9}$ A; and the threshold voltage was $-0.3$ V. Accordingly, a p type-operating organic semiconductor element was achieved. These values of the transistor were the same as the measurements before the interlayer insulating film was formed, which means that this process did not cause any element deterioration.

Specifically, the printing paste (ink) used to form the interlayer insulating film includes filler for adjusting viscosity of the main polymer (polyvinyl butyral resin) and an organic solvent. When the selected organic solvent has the ability of dissolving the organic semiconductor film disposed as the base, a failure occurs in the transistor. In order to confirm that the printing paste according to an embodiment of the present invention does not affect the performance of the transistor, the performance of the transistor was evaluated before and after forming the interlayer insulating film. Properties of the organic TFT manufactured by forming the organic semiconductor film were as follows: the on current was $6\times10^{-6}$ A, the off current was $3\times10^{-9}$ A, and the threshold voltage was $-0.3$ V. On the other hand, the performance of the transistor after the interlayer insulating film was formed was as follows: the on current was $6\times10^{-6}$ A, the off current was $3\times10^{-9}$ A, and the threshold voltage was $-0.3$ V. Accordingly, no changes in properties were observed.

EXAMPLE 2

Figure 4:
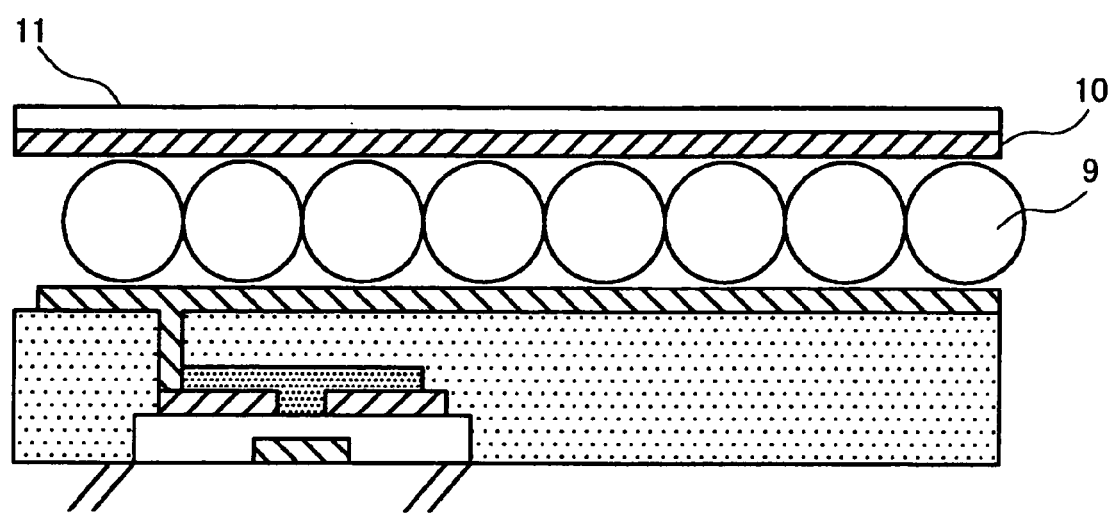
FIG. 4 is a schematic diagram of an electrophoretic display pixel according to an embodiment of the present invention.
Figure 5:
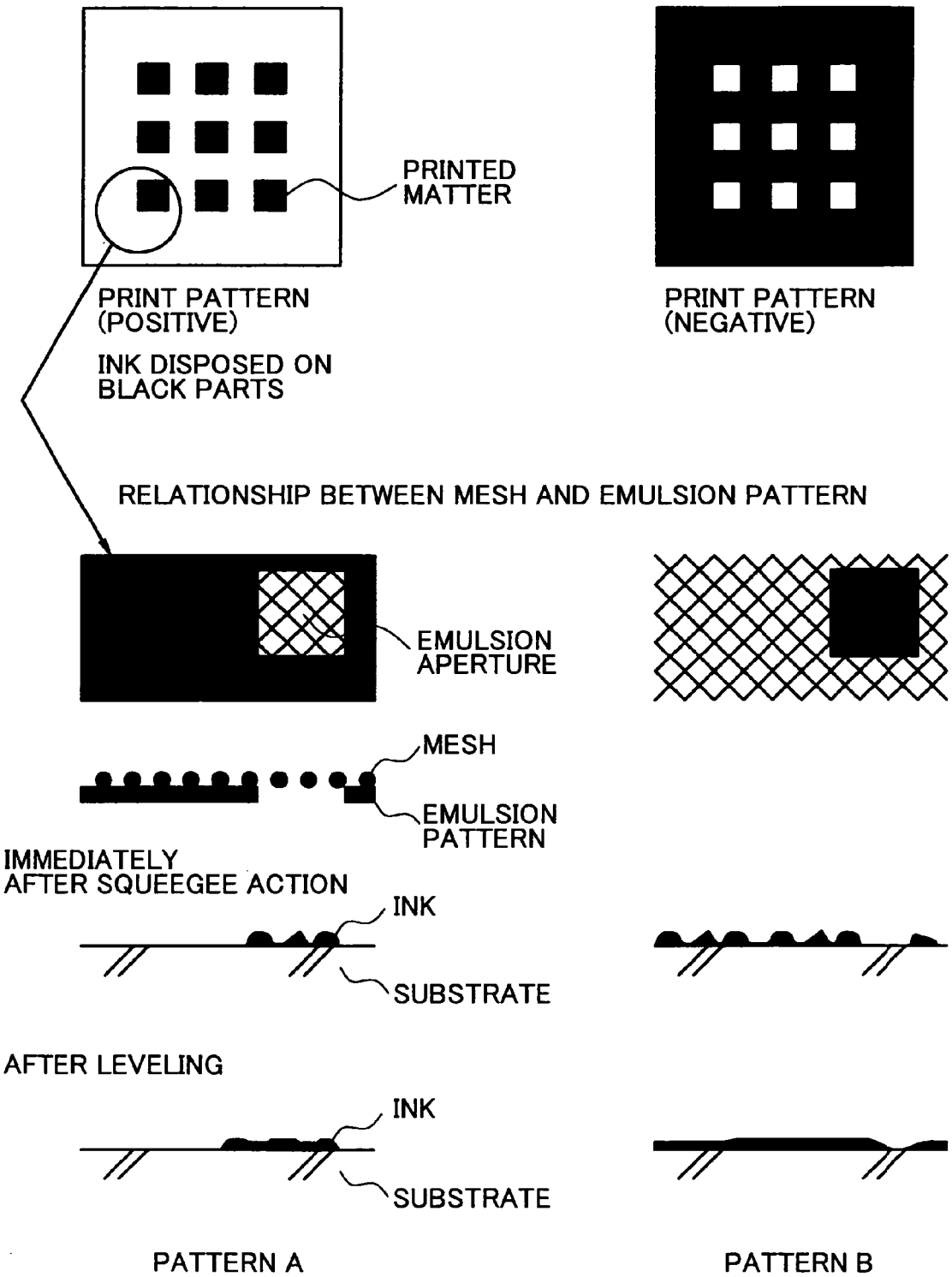
FIG. 5 is a diagram for describing printing patterns.

The electrophoretic display according to an embodiment of the present invention has the structure as shown in FIG. 4. Specifically, the supporting substrate 11 is disposed on the transparent electrode (ITO: Indium Tin Oxide) 10 as a common electrode. The electrophoretic microcapsules 9 for displaying black/white are sandwiched between the transparent electrode 10 and the third electrode 8 (individual electrode, pixel electrode) of the organic transistor active substrate formed by the method described in example 1. It was observed that the color displayed by the pixel change between black and white by applying a voltage of $-20$ V to the scanning line and applying a voltage of $\pm20$ V to the (pixel) signal line. The electrophoretic microcapsules 9 are medium that can display black and white, and each capsule includes white particles, black particles and an insulating solvent.

The method of manufacturing the electrophoretic display is described in detail.

Titanium oxide: 20 parts by weight, acid polymer: 1 part by weight, silicon polymer graft carbon black MX3-GRX-001 (manufactured by Nippon Shokubai Co., Ltd.): 2 parts by weight, silicon oil KF96L-1cs (manufactured by Shin-Etsu Chemical Co., Ltd.): 77 parts by weight (Total: 100 parts by weight)

A dispersion liquid was made by mixing together these compositions by these proportions, which was dispersed for one hour with ultrasonic waves, to obtain a dispersion liquid with black and white particles.

Microcapsules were made from the dispersion liquid by a gelatin/acacia gum complex coacervation method. The average capsule diameter was approximately 60 μm.

The microcapsules were dispersed in a urethane resin solvent, spread on the film substrate with the transparent electrode film by a wire blade method, thereby forming a uniform microcapsule sheet. This sheet was bound to the organic TFT substrate, to form the electrophoretic display pixel shown in FIG. 4.

Figure 7:
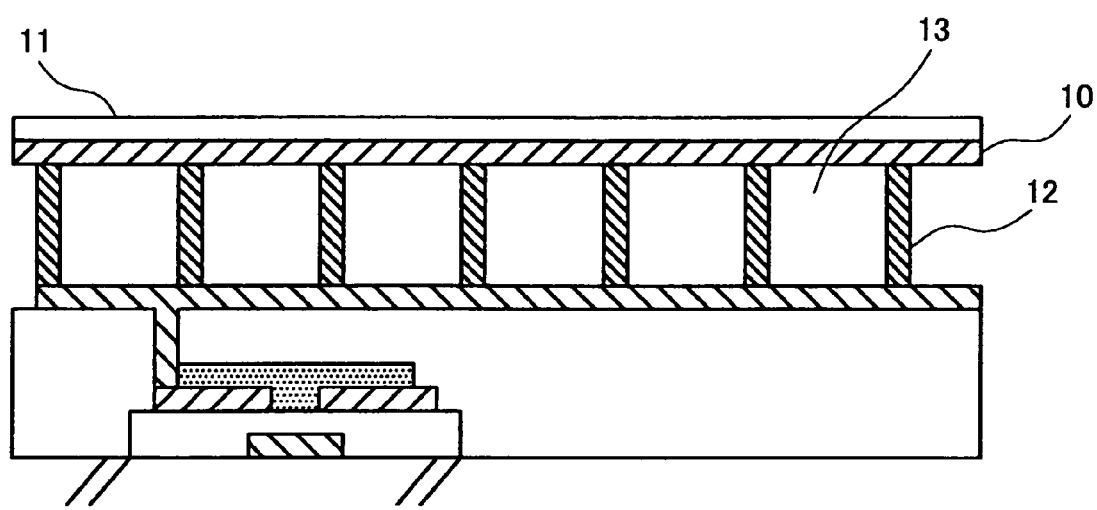
FIG. 7 is another example of an electrophoretic display pixel according to an embodiment of the present invention.

Next, a description is given of a method of manufacturing an electrophoretic display pixel shown in FIG. 7, in which the dispersion liquid is sealed by partition layers 12.

A film made from a photoresist TMMR S2000 manufactured by Tokyo Ohka Kogyo Co., Ltd. was coated onto a glass substrate by spin coating, having a film thickness of 40 μm. A honeycomb pattern with partition layer widths of 20 μm and apertures of 180 μm was formed by performing exposure/development. This resist pattern was peeled off from the glass substrate, and partition layers were formed.

The partition layers were laminated onto an organic transistor active substrate, the dispersion liquid was dropped thereon, the supporting substrate with the transparent electrode layer was bound by roller pressurization, and the electrophoretic display pixel shown in FIG. 7 was formed.

According to one embodiment of the present invention, it is possible to manufacture an active substrate including an organic TFT that can be entirely manufactured by printing processes, so that costs of the manufacturing operation and the manufacturing device can be reduced. Further, an electrophoretic display can be manufactured at low cost.

Moreover, with the printing method according to one embodiment of the present invention, expensive equipment such as a vacuum film formation device is unnecessary, and conventional etching processes for pattern formation are unnecessary (reduction of manufacturing steps). Reduction of manufacturing steps leads to higher yields. Further, materials are deposited only on necessary parts so that use efficiency of the materials is enhanced; therefore, elements can be manufactured at one-tenth of conventional costs.

The present invention is not limited to the specifically disclosed embodiment, and variations and modifications may be made without departing from the scope of the present invention.

The present application is based on Japanese Priority Patent Application No. 2005-260077, filed on Sep. 8, 2005, and Japanese Priority Patent Application No. 2006-190067, filed on Jul. 11, 2006, the entire contents of which are hereby incorporated by reference.

What is claimed is:

1. A method of manufacturing an organic transistor active substrate including an organic transistor in which a first electrode is formed on a substrate, a first insulating film is formed on the first electrode, a pair of second electrodes is formed on the first insulating film, an active layer made of an organic semiconductor material is formed on the pair of second electrodes, a second insulating film is formed on the organic transistor, and a third electrode is formed on the second insulating film, wherein the third electrode is electrically coupled to one of the second electrodes via a through-hole provided through the second insulating film, the method comprising the steps of:

forming the first electrode, the pair of second electrodes and the active layer, by inkjet ejection;
forming the first insulating film by coating; and
forming the second insulating film and the third electrode, by screen printing, wherein
the second insulating film is a single layer in direct contact with, and between, the active layer and the third electrode,
the second insulating film is formed by dissolving a component including polyvinyl butyral resin with an alcohol solvent having at least ether linkage to obtain a paste, and coating the paste onto the organic transistor by screen printing,
the third electrode is primarily made of silver,
the second insulating film and the third electrode are formed under similar screen plate conditions, and
the similar screen plate conditions include printing with a screen plate of a similar calendar mesh.

2. The method of manufacturing the organic transistor active substrate according to claim 1, wherein the first insulating film is a polyimide film.

3. The method of manufacturing the organic transistor active substrate according to claim 1, wherein the active layer is primarily made of a pi conjugated polymer material including triaryl amine.

4. A method of manufacturing an organic transistor active substrate including an organic transistor in which a first electrode is formed on a substrate, a first insulating film is formed on the first electrode, a pair of second electrodes is formed on the first insulating film, an active layer made of an organic semiconductor material is formed on the pair of second electrodes, a second insulating film is formed on the organic transistor, and a third electrode is formed on the second insulating film, wherein the third electrode is electrically coupled to one of the second electrodes via a through-hole provided through the second insulating film, the method comprising the steps of:

forming the first electrode, the pair of second electrodes and the active layer by inkjet ejection;
forming the first insulating film by coating; and
forming the second insulating film and the third electrode by screen printing,
wherein the second insulating film is formed from an ink paste obtained by dissolving resin with a solvent including at least butoxyethanol, and
wherein the second insulating film is a single layer in direct contact with, and between, the active layer and the third electrode,
the second insulating film is formed by dissolving a component including polyvinyl butyral resin with an alcohol solvent having at least ether linkage to obtain a paste, and coating the paste onto the organic transistor by screen printing,
the third electrode is primarily made of silver,
the second insulating film and the third electrode are formed under similar screen plate conditions, and
the similar screen plate conditions include printing with a screen plate of a similar calendar mesh.

5. The method according to claim 4, wherein the first insulating film is a polyimide film.

6. The method according to claim 4, wherein the active layer is primarily made of a pi conjugated polymer material including triaryl amine.

7. A method of manufacturing an organic transistor active substrate including an organic transistor, the method comprising the steps of:

forming a first electrode on a substrate, by inkjet ejection;
forming a first insulating film on the first electrode, by coating;
forming a pair of second electrodes on the first insulating film, by inkjet ejection;
forming an active layer made of an organic semiconductor material, on the pair of second electrodes, by inkjet ejection;
forming a second insulating film on the organic transistor, by screen printing; and
forming a third electrode on the second insulating film, by screen printing, the third electrode being electrically coupled to one of the second electrodes via a through-hole provided through the second insulating film,
wherein the second insulating film is a single layer in direct contact with, and between, the active layer and the third electrode,
the second insulating film is formed by dissolving a component including polyvinyl butyral resin with an alcohol solvent having at least ether linkage to obtain a paste, and coating the paste onto the organic transistor by screen printing,
the third electrode is primarily made of silver,
the second insulating film and the third electrode are formed under similar screen plate conditions, and
the similar screen plate conditions include printing with a screen plate of a similar calendar mesh.

8. The method according to claim 7, wherein the first insulating film is a polyimide film.

9. The method according to claim 7, wherein the active layer is primarily made of a pi conjugated polymer material including triaryl amine.

* * * * *